United States Patent [19]

Huang et al.

[11] Patent Number: 5,640,337

[45] Date of Patent: *Jun. 17, 1997

[54] METHOD AND APPARATUS FOR INTERIM IN-SITU TESTING OF AN ELECTRONIC SYSTEM WITH AN INCHOATE ASIC

[75] Inventors: Jen-Hsun Huang; Michael D. Rostoker, both of San Jose; David Gluss, Woodside, all of Calif.

[73] Assignee: LSI Logic Corp., Milpitas, Calif.

[*] Notice: The term of this patent shall not extend beyond the expiration date of Pat. No. 5,339,262.

[21] Appl. No.: 696,141

[22] Filed: Aug. 13, 1996

Related U.S. Application Data

[63] Continuation of Ser. No. 599,107, Feb. 9, 1996, abandoned, which is a continuation of Ser. No. 335,092, Nov. 7, 1994, abandoned, which is a continuation of Ser. No. 937,643, Aug. 13, 1992, which is a continuation-in-part of Ser. No. 911,846, Jul. 10, 1992, Pat. No. 5,339,262.

[51] Int. Cl.$^6$ ............... G06F 17/00; G06F 11/00; G01R 31/28
[52] U.S. Cl. ............ 364/578; 364/489; 371/25.1; 324/527; 395/183.04; 395/183.09
[58] Field of Search ............... 364/578, 580, 364/488, 489, 490, 491; 395/183.04, 183.06, 183.09; 324/527; 371/25.1

[56] References Cited

U.S. PATENT DOCUMENTS

| | | | |
|---|---|---|---|
| 4,644,487 | 2/1987 | Smith | 364/578 |
| 4,674,089 | 6/1987 | Poret et al. | 371/16.2 |
| 4,901,259 | 2/1990 | Watkins | 364/578 |
| 5,003,507 | 3/1991 | Johnson | 364/578 |
| 5,036,473 | 7/1991 | Butts et al. | 364/489 |
| 5,047,971 | 9/1991 | Horwitz | 364/578 |
| 5,049,814 | 9/1991 | Walker, III et al. | 324/158.1 |
| 5,109,353 | 4/1992 | Sample et al. | 364/578 |
| 5,132,971 | 7/1992 | Oguma et al. | 371/16.2 |
| 5,233,612 | 8/1993 | Huyskens et al. | 371/16.2 |
| 5,253,181 | 10/1993 | Marui et al. | 364/578 |
| 5,339,262 | 8/1994 | Rostoker et al. | 364/578 |

*Primary Examiner*—Ellis B. Ramirez
*Assistant Examiner*—Eric B. Stamber
*Attorney, Agent, or Firm*—Oppeneheimer Poms Smith

[57] ABSTRACT

A technique is described for testing the performance of a target electronic system ultimately employing an ASIC comprising a core cell and surrounding logic, using an inchoate (designed, but not yet fabricated) ASIC on an interim basis. In one embodiment, a Q-part, or qualification part, which is essentially a bond-out of the core cell, is used in conjunction with programmable logic devices configured to perform the function of the surrounding logic. The Q-part and programmable logic are interconnected on a pod, and plugged into an interim version of a target electronic system. In another embodiment, the Q-part is software-simulated and interconnected on the pod to programmable logic devices. The programmable logic devices may be programmed either on-pod or off-pod, and signals incident to the operation of the pod plugged into the interim electronic system can be monitored and controlled.

10 Claims, 7 Drawing Sheets

PRIOR ART

Figure 4a

PRIOR ART

METHOD AND APPARATUS FOR INTERIM IN-SITU TESTING OF AN ELECTRONIC SYSTEM WITH AN INCHOATE ASIC

This application is a continuation of now abandoned application Ser. No. 08/599,107, filed Feb. 9, 1996, which is a continuation of U.S. patent application Ser. No. 08/335,092, filed Nov. 7, 1994, now abandoned, which is a continuation of U.S. patent application Ser. No. 07/937,643, filed Aug. 31, 1992, pending, which is a continuation-in-part of U.S. patent application Ser. No. 07/911,846, filed Jul. 10, 1992, now U.S. Pat. No. 5,339,262.

TECHNICAL FIELD OF THE INVENTION

The invention relates generally to electronic testing, and more particularly to in-circuit, at-speed testing of electronic systems that use ASICs (Application Specific Integrated Circuits).

BACKGROUND OF THE INVENTION

Many of today's electronic systems are designed with highly complicated integrated circuits (ICs) such as: (1) high-level microprocessors, and (2) "intelligent" peripheral devices. Such electronic systems may be called the "target environment" for these integrated circuits. These highly complicated ICs offer a great deal of functionality in a very small space, and at very low cost. Often such highly complicated ICs contain the equivalent of hundreds of thousands of logic gates, or millions of transistors. Because so much of the functionality of these highly complicated ICs is hidden from the user, it is often difficult to be certain at the time an electronic system incorporating them is designed that the final implementation of the electronic system (target environment) will function properly when it is put together; in other words, to validate the performance of the electronic system.

Recently, semi-custom integrated circuit devices known generally as ASICs (Application Specific Integrated Circuits) have become popular with electronic system designers. These devices (highly complicated integrated circuits themselves) allow some degree of customization of the circuitry contained thereupon. Using one or more ASICs specially designed for an application, a system designer can dramatically reduce the number of components (integrated circuit devices and other electronic parts) required to build an electronic system.

ASICs are available in a number of different technologies and in a variety of forms. Generally, ASICs are available from an ASIC manufacturer who has provided a number of "template" circuits which may be incorporated onto the ASIC by an ASIC user, and a number of design guidelines and restrictions which arise from the nature of the specific ASIC technology to be used.

Two primary forms of ASIC are widely available: gate-arrays and standard cell ASICs. Gate-arrays are basically an array of pre-integrated transistors ("sea of gates") and input/output pads (I/O pads) on an integrated circuit chip without interconnecting conductors. The ASIC manufacturer supplies the ASIC user with a set of standard circuits blocks (typically gates, flip-flops, multiplexers, decoders, counters, shift-registers, etc.) which may be constructed from these transistors and I/O pads and which the user employs to specify the circuitry to be contained on the ASIC in the form of a circuit diagram. Only those circuit blocks which may be readily built from "standard" transistors in the array can be offered. These circuit blocks represent the interconnections required between a set of transistors and/or I/O pad required to construct the circuit which will perform their respective functions. The interconnection of these transistors and I/O pads is accomplished by the ASIC manufacturer according to the user's circuit diagrams. After interconnecting conductors have been applied to the ASIC, the ASIC is packaged, tested, and shipped to the user.

Standard-cell ASICs are similar to gate-arrays, from the user's point of view, except that a wider variety of circuit blocks is available. The user employs a set of standard pre-defined circuit blocks to specify the circuity to be incorporated into a standard-cell ASIC in the form of the circuit diagram. In the case of standard-cell ASICs, however, no pre-integrated structures typically exist. The pre-defined circuit blocks used by the user to define his circuitry represent complete circuit modules to be integrated onto a integrated circuit chip. Since "standard" transistors are not a limiting factor, as they are for gate-arrays, circuit geometries may be optimized for each circuit module represented by a circuit block, allowing a much wider variety of circuit blocks to be offered to the user. These circuit blocks are arranged onto a "blank" integrated circuit chip in "cookie cutter" fashion by the ASIC manufacturer according to the circuit diagram supplied by the ASIC user. As for gate-arrays, after the standard cell integration process is completed, the chips are packaged, tested and shipped to the user.

In a variation on the standard-cell theme, many ASIC manufacturers offer "core-cells", typically very large and complicated circuits (e.g., microprocessors, peripheral controllers, etc.) which may be incorporated into an ASIC design as yet another circuit block, albeit a very large one. These core-cells are typically used in conjunction with other "surrounding logic" on an ASIC to perform an application-specific function. ASICs incorporating a core-cell and surrounding logic are called "core-cell-based ASICs".

Some very large gate-based circuit blocks similar to core cells are offered for gate-arrays, as well. While core-cells for gate arrays do not generally offer the same range of function, they can be extremely complicated gate-based designs. Gate-arrays making use of such core-cell type functions are also termed "core-cell-based ASICs."

The creation (design process) of these core-cell-based ASICs and electronic systems follow similar -tracks from concept to reality, typically beginning with a high-level design of the electronic system and its major components. These high-level designs may be modelled in various high-level software description languages, e.g. VHDL, which allow partial design and verification of the overall behavior of the electronic system and/or its components. The ultimate goal is to implement the electronic system and its components in physical reality. Between these two extremes, concept and implementation, various incarnations of the design are realized. For example, the following terms and definitions apply to the electronic system design process:

Component (electronic component or device): any physical electronic circuit element (such as an IC, ASIC, resistor, capacitor, diode) which is designed into an electronic system.

At-speed: operating at normal operating speeds and faithfully representing actual performance.

Logical equivalent: a circuit, component, or technique which performs the same function as something else, not necessarily at-speed.

Core-cell: a large, pre-defined circuit block to be incorporated onto an ASIC, typically in conjunction with additional surrounding logic. Core-cells functions typically include general-purpose microprocessor, disk drive controller, communications controllers, etc.

Surrounding logic: logic used in conjunction with a core-cell on an ASIC to perform an application-specific function.

ASIC: Application Specific Integrated Circuit, as described hereinabove.

Core-cell-based ASIC: an ASIC incorporating at least one core-cell and surrounding logic.

ASIC manufacturer (or ASIC provider): a manufacturer (vendor) that designs ASIC technology and provides the service of ASIC fabrication to ASIC users (see below).

ASIC user: a customer of an ASIC manufacturer, usually an electronic designer, who specifies the circuitry to be incorporated onto an ASIC according to the ASIC manufacturer's guidelines, restrictions, and methodology.

Electronic system: an electronic circuit comprising other components such as ICs, ASICs, etc.

Electronic System Designer: a designer (usually an electrical engineer), who designs electronic systems. May also be an ASIC designer, but not necessarily.

ICE or In-Circuit Emulator: test apparatus specifically designed to replace an IC for test purposes, and which allows greater controllability and observability of the test process than would otherwise be available.

Target: a destination for or final form of a design. Examples:

Target ASIC: an ASIC into which a core cell, circuit block or surrounding logic is incorporated, in its final manufactured form.

Target system: an electronic system into which an ASIC or electronic component is designed.

Target environment: the "standard" operating environment of an electronic component or system in its final form. For example: a circuit board may be the target environment for an ASIC; a computer may be the target environment for a circuit board, etc.

Interim: intermediate or temporary. Usually provided for test purposes.

Interim ASIC: a functional equivalent of an ASIC.

Interim Component: a functionally equivalent substitute for a component, typically used for testing and verification purposes.

Interim system: an electronic system functionally equivalent to a target system which is built prior to construction of and which closely resembles a target system or which incorporates interim components; and which may have minor modification made (e.g., test points, sockets, etc.) to facilitate verification and testing.

The use of the term "target" is largely a matter of perspective. For example: a system breadboard may be an interim system from the point of view of a manufacturer, but may simultaneously be a "target system" for a logical equivalent, interim component, ASIC, or ICE.

Inchoate: designed, but not yet fabricated.

Inchoate ASIC: an ASIC which has been designed but which has not yet been fabricated.

Because of the extreme internal complexity of many modern electronic systems, particularly those incorporating ASICs, and of the highly complicated ICs, the design process itself has given rise to a great many techniques for verifying that an electronic system will perform as planned. One technique commonly used to verify the performance of an electronic system is to build a "breadboard", or quick test circuit, incorporating the components in question and to run it in an environment similar to the environment of its final application to verify that the electronic system does indeed function as planned. If the breadboard does not function correctly, there is an early warning that the design of the electronic system must be modified.

Breadboarding of an electronic system, however, assumes the availability of all components (or the functional equivalents thereof) necessary to build the electronic system. Often, it is not possible or practical to acquire all of the requisite components early in the design process, particularly if custom designed components have been employed in the design of the electronic system.

As integrated circuit (and ASIC) complexities have grown, and electronic system complexities have grown with them (particularly in programmable, microprocessor-based systems where software governs a great deal of system functionality), it has become increasingly difficult to troubleshoot electronic systems, even when a breadboard is available. In response to this problem, at least for microprocessor-based systems, numerous manufacturers have produced in-circuit emulators (ICE).

In circuit emulation systems (ICE systems) are intended to plug into a target system in place of an IC, usually a microprocessor, and to emulate the function of the IC exactly. The ICE system interfaces with the target system via a "pod" which has a plug identical in shape and pin configuration to that of the microprocessor to be emulated. However, ICE systems also add a few capabilities, such as the ability to: halt execution upon a specified set of conditions (e.g., execution of a particular instruction, modification of a memory location, access of a particular I/O port, etc.); examine/modify processor registers; examine/modify memory; record (trace) a series of processor operations; among many other capabilities. This is usually accomplished by selectively monitoring and/or intercepting signals from the target system before passing them back to the target system. ICE systems are well known and in wide use in the present art. Intel Corporation manufactures ICE systems having these capabilities, among others, for most of its microprocessor products.

Most ICE systems employ either a specially designed variation of the microprocessor they are designed to emulate, or a microprocessor identical to the one they are designed to emulate. Usually, the purpose of using a special variation of a microprocessor is to gain access to signals on-chip which would otherwise be unavailable. This is particularly true for microprocessors which have on-chip bus cache units. These units are designed to anticipate the needs of the microprocessor's execution unit by buffering memory locations beyond the address of the instruction being executed, the assumption being that since most programs instructions follow one another, there is a high probability that the next instruction Will already be buffered (cached) when the execution unit needs it. While this is very efficient for the microprocessor, it makes it very difficult to tell what is going on inside the microprocessor by looking at the external signals. A great deal of the internal function of the microprocessor is hidden from the outside world. As a result, special variations on this kind of microprocessor are required by in-circuit emulators (ICE's) so that the ICE may gain information about and control over the internal operation of the microprocessor. Without these special variations, it would be difficult to stop the microprocessor at exactly a particular point in a program. ICE systems for simpler microprocessors (particularly non-cached microprocessors) can often employ standard microprocessor chips.

One of the greatest advantages of the ICE system is its in-situ emulation (emulation or simulation in the actual target environment). The user plugs in a pod that replaces his microprocessor and, without modification to his system, he has much greater controllability and observability over his system, due to the ICE.

Many designs of electronic systems today, however, also incorporate semi-custom integrated circuits called ASICs. The term ASIC is a generic term that covers a great number of technologies and a great range of complexities, but ASICs are all semi-custom integrated circuits, usually based upon a gate-array or standard-cell product. The system incorporating an ASIC may be called the "target environment" of the ASIC.

Modern ASICs may incorporate the equivalent of tens of thousands of gates. Some standard cell offerings permit densities as high as 100,000 gates and above. Many of these ASICs incorporate a "core-cell", such as a "Core Microprocessor" or similar function. A core-cell is a predefined functional equivalent of a functional block generally contained on a commercial integrated circuit. For example, core-cells are available for microprocessors, UARTs (Universal Asynchronous Receiver/Transmitters), microprocessor support components, peripheral interfaces, disk controllers, network interfaces, etc. Basically, a "core microprocessor" is a large pre-defined functional equivalent of a microprocessor which can be embedded into a design on an ASIC, and surrounded by other logic (surrounding logic). The use of core-cells permits rapid design of "systems on a chip", which can be extremely sophisticated and complex.

Core-cells (also referred to as macrocell or "megacells") differ slightly from their commercially available counterparts, in that they are designed specifically to become a part of a larger design. As such, the signals at their boundaries (interface signals, I/O signals) are likely to be unbuffered, internal logic signal, and are generally not "tri-state" capable (capable of bidirectional or shared operation by virtue of drivers which can be turned off), as are some of the interface signals on typical commercially available microprocessors.

Figure 1A:
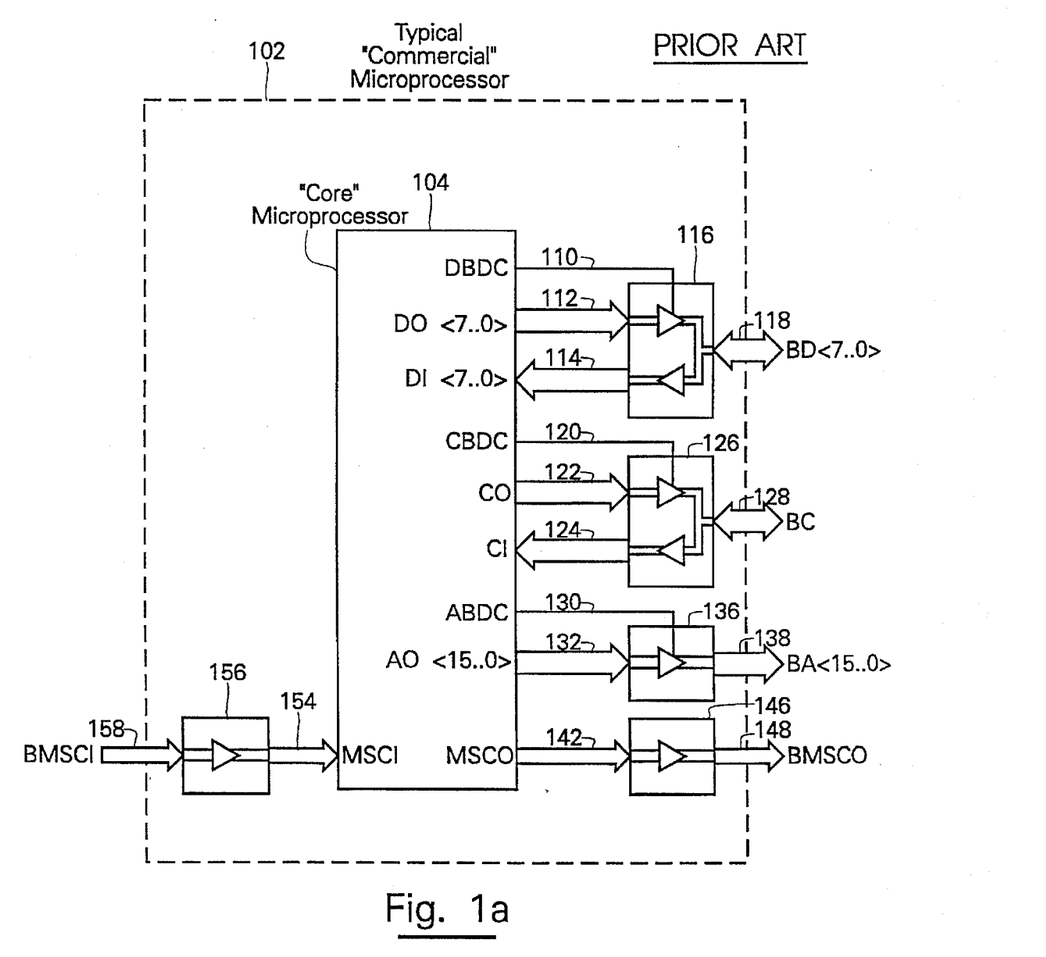
FIG. 1a is a schematic diagram illustrating the differences between a "core microprocessor" and a typical commercial microprocessor, according to the prior art.

FIG. 1a illustrates the difference between a typical "core" microprocessor 104 and a typical "commercial" microprocessor 102. As an example, a typical 8-bit core microprocessor 104 is shown having a data bus driver control signal "DBDC" 110, an 8-bit data output bus "DO<7..0>" 112, an 8-bit data input bus "DI<7..0>" 114, a control bus driver control signal "CBDC" 120, a control output bus "CO" 122 comprising a plurality of control output signals, a control input bus "CI" 124 comprising a plurality of control input signals, an address bus driver control signal "ABDC" 130, a 16-bit address output bus "AO<15..0>" 132, miscellaneous output signals "MSCO" 142, and miscellaneous input signals "MSCI" 154.

The interface signals of the core microprocessor 104 are unbuffered and unprotected (from static electricity, etc.). Also, the output signals on the core microprocessor 104 (e.g., 112, 122, 124, etc.) do not have drivers that can be disabled and placed in a high impedance state. This is because the core microprocessor is intended to be used on an ASIC as a part of a larger design, and does not incorporate the driver and protection circuits necessary for interfacing with the outside world. In order to make a "commercial" type microprocessor (e.g. 102 in FIG. 1) out of a core microprocessor, it is necessary to add these driver and protection circuits.

Dashed box 102 in FIG. 1a represents the functional equivalent of a typical commercial-type microprocessor. This is made from core microprocessor 104 by adding drivers and receivers as shown. An 8-bit wide driver/receiver circuit 116 is provided (having eight driver circuits connected in common to a driver enable signal, and eight receiver circuits) to interface with an 8-bit external bi-directional data bus 118, by connecting it such that: data input bus 114 is driven by the outputs of the receivers of driver/receiver circuit 116 the inputs of which are connected to external data bus 118; data output bus 112 is applied to the inputs of the driver circuits of driver/receiver circuit 116, the outputs of which drive external data bus 118; and data bus driver control signal "DBDC" 110 is connected to the driver control input of driver/receiver circuit 116, such that it controls the enabled/disabled condition of the drivers of driver/receiver circuit 116.

Similarly, a multi-bit bidirectional external control bus 128 is interfaced to core microprocessor via a multi-bit driver/receiver circuit 126 (having multiple driver circuits connected in common to a driver enable signal, and multiple receiver circuits), by connecting it such that: control input bus 124 is driven by the outputs of the receivers of driver/receiver circuit 126 the inputs of which are connected to external control bus 128; control output bus 124 is applied to the inputs of the driver circuits of driver/receiver circuit 126, the outputs of which drive external control bus 128; and control bus driver control signal "CBDC" 120 is connected to the driver control input of driver/receiver circuit 126, such that it controls the enabled/disabled condition of the drivers of driver/receiver circuit 126.

The data and control busses of the core microprocessor are arranged to allow for data or control input and output. In the core microprocessor shown, however, there is no address input bus, but certain modes of operation of the commercial device dictate that the external address bus "BA<15..0>" 138 must be left undriven by the microprocessor 102 so that other devices may drive it (for example, for DMA, or Direct Memory Access transfers, whereby external devices may access memory directly by stealing borrowing time cycles from the microprocessor and generating their own control and address signals). As a result, tri-state drivers (drivers which can be disabled) are required. To this end, a 16 bit wide tri-state driver circuit 136 having a common enable signal is connected such that the drivers receive their inputs from internal address bus 132 and drive their outputs onto external address bus 138. The enable input of tri-state driver circuit 136 is connected to address bus driver control signal 130.

Miscellaneous outputs "MSCO" 142 on the core microprocessor which are permanently driven (e.g., a DMA request acknowledge signal) are buffered by drivers 146 and placed on buffered external outputs "BMSCO" 148. Similarly, external inputs 158 are buffered by receivers 156 and place onto internal miscellaneous input bus 154.

Figure 1B:
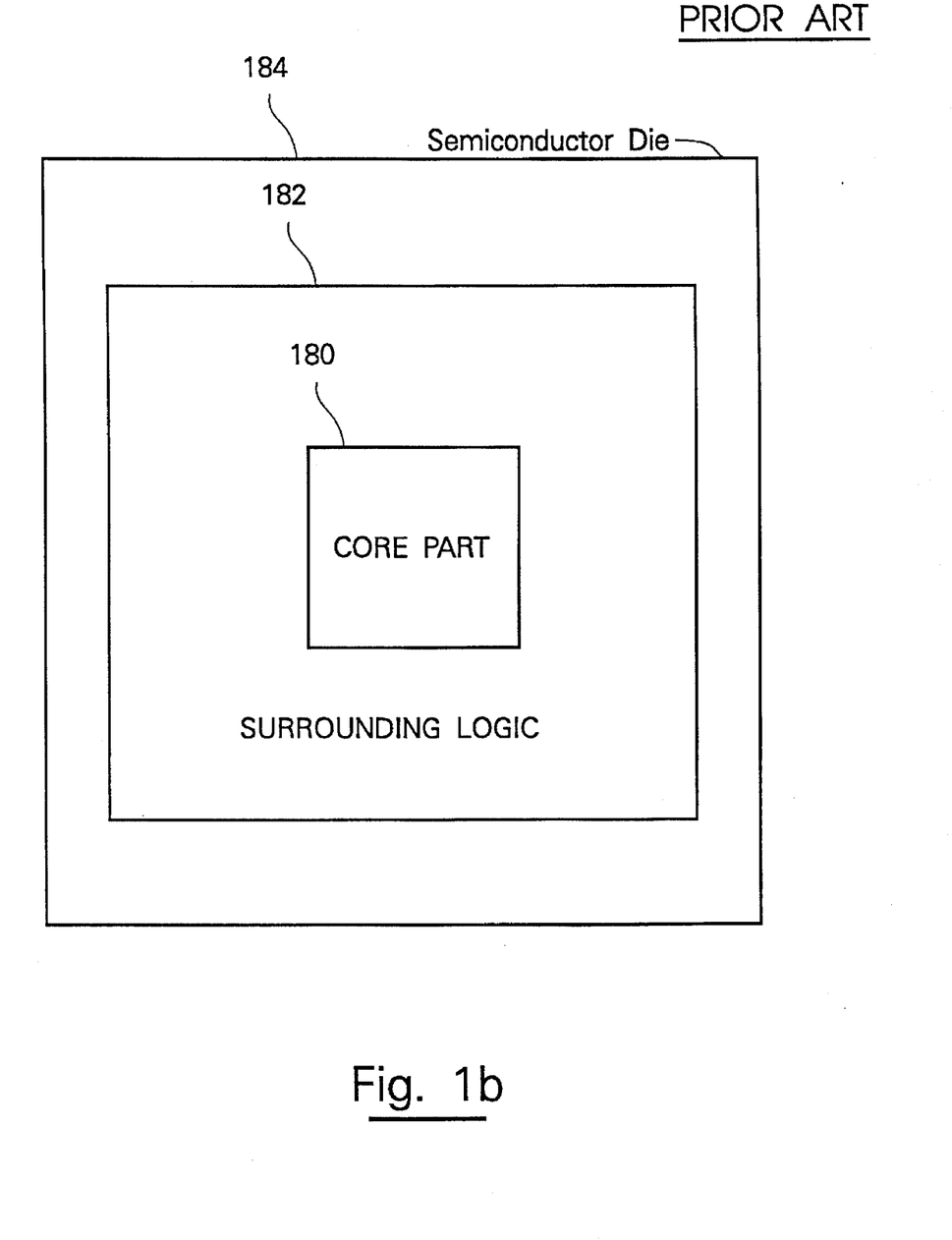
FIG. 1b is a block diagram showing the relationship between a core cell and an ASIC employing it, according to the prior art.

FIG. 1b illustrates the relationship of a Core part (such as 104 with respect to FIG. 1a) to an ASIC into which it is incorporated. A core part 180 is incorporated into a semiconductor die 184 by placing it on the die and connecting it to surrounding logic 182. Typically, semiconductor die 184 is an ASIC whose function includes the function of the core part 180. Surrounding logic 182 interfaces with the signals of the core part 180, providing the remainder of the functions of the ASIC.

Industry trends are toward increasing pressure for rapid turnaround of designs. Technology changes quickly and delays may mean the loss of a market. As a result, system designs must work both quickly and accurately. Accuracy is extremely important because an error discovered late in a design cycle can cause large parts of the design cycle to be repeated, causing delays.

This is especially true for system designs which incorporate ASICs. After an ASIC design is completed,-various layout and simulation steps must be performed, and the ASICs must be fabricated. This process often requires a great deal of time. If an error is discovered in an ASIC design after the ASIC has been manufactured, then any remaining ASICs must be scrapped (usually), a new (possibly shorter) design cycle must be started, and a new fabrication cycle is required. This is almost as bad as having to start all over again, in terms of delays. Evidently, then, it is highly desirable for a system designer to take any and all steps necessary to ensure that his ASIC design will work before the ASIC is manufactured.

There are actually two complementary problems that inherent in ASIC validation:

1) determining that the ASIC, as designed, will function properly in its target environment; and
2) determining that the target environment, as designed, will function properly with the ASIC.

By way of analogy, a musician may practice (and presumably perfect) his part separately from an ensemble, and the ensemble may rehearse without the musician, but there is no certainty that there will be total harmony until musician and ensemble rehearse together.

It is in these areas that late discoveries of problems often occur. This is because most simulations are directed to ensuring that the ASIC vendor will produce exactly the ASIC that the designer designed. The ASIC user and electronic system designer have few choices for validating that an electronic system will function correctly with an ASIC, other than waiting for a completed ASIC and trying it in his system.

A number of software-based "system simulation" tools, have been in use for a number of years, among them "N.2".

Typically these tools operate at a behavioral level, and require the system designer to describe his system design in the form of a behavioral model. Since the behavior of a system and its components is accomplished in a manner largely unrelated to the details of the system design (behavioral descriptions tend to "paraphrase" the designs of the items being described), this constitutes a second, redundant design activity.

Typically, these system simulators provide only an overview of system performance and do not give a great deal of insight into problems which may occur at the lowest levels of the design. Further, behavioral models often oversimplify low-level behavior of hardware and software systems, and do not necessarily produce completely accurate simulations, particularly if the system designer is responsible for the modelling of his own system. Since the design, in this case, is being done twice (once at a detailed level and once for the behavioral models), there is a good chance for differences to occur between the original system design and the behavioral description thereof. Some behavioral models have been made commercially available for certain widely used integrated circuits (such as microprocessors, etc.), and give very good approximations of the function of the modelled part, even to the point of being able to run code on microprocessor models. However, software models (behavioral or other) for custom-designed components (e.g., ASICs) must usually be generated by the designer of the custom-designed components.

It is also possible to perform software-based gate-level simulations of a system design, provided that gate-level models are available for all of the system components, but for such large, complex integrated circuits as microprocessors and peripheral controllers, these models are difficult or impossible to acquire, and if they can be acquired they are often extremely expensive. Gate-level models tend to run very slowly (potentially many orders of magnitude slower) compared to the systems they model.

Hardware-based simulation accelerators have been designed to accommodate simulations at a number of levels (including gate-level, transistor-level, behavioral level, etc.) As with software-based simulations, the more detailed and accurate the simulation required (a gate-level simulation is more detailed and accurate than a behavioral simulation) the slower the simulation runs. Even with a hardware-based simulation accelerator, all but the most trivial of simulations run many times slower than the systems they model.

Some recent advances in automatic model generation have provided for highly accurate automatically generated models. In modern systems, this is almost a pre-requisite. It is even possible to "plug" these simulation models into Other simulated circuits and to attempt to exercise the modelled (simulated) circuits together as a system. But the more detailed and accurate the model (the more complicated the model description), the slower it runs on any simulator, software-based or accelerator-based. At present, (except for the simulation of relatively trivial, small functions, or of very slow systems), simulations of systems run orders of magnitude slower than the systems they model, and do not necessarily model low-level behavior accurately.

A good deal of the pressure for real-time simulation, which is not possible by any method except ICE methods, is due to the fact that in software-based systems, the conditions which cause systems to fail may occur only infrequently, and may be timing-based problems which can only be simulated at-speed, or which would take too long to detect at a lower speed. Such problems often include interrupt overrun conditions, bus contention problems, errors in the handling of asynchronous events, etc., which may be difficult or impossible to detect except in the actual target environment. For this reason, most electronic system designers employ an ICE (in-circuit emulator) for in-situ simulation (simulation in the target hardware, at-speed).

ASIC users, especially those who use such embedded functions as "core microprocessors" surrounded by logic, are unable to take advantage of in-circuit emulation, because no emulator exists which is compatible with their specialized design. While one of the ultimate goals of systems that use this type of ASIC is to provide near-optimal packaging and cost-effectiveness, the design cycle can be particularly troublesome since it is difficult, at best, to determine whether a target system will function correctly when the ASIC is plugged in. In fact, it is sometimes considered risky to build the system at all or to commit to purchasing production quantities of components until the function of the ASIC can be verified in a breadboard.

A programmable circuit board technology known as "FPCB" or "Field-Programmable Circuit Board" is produced by APTIX, Inc. This prior-art technology is aimed at providing flexible breadboards without requiring hand wiring.

Figure 4A:
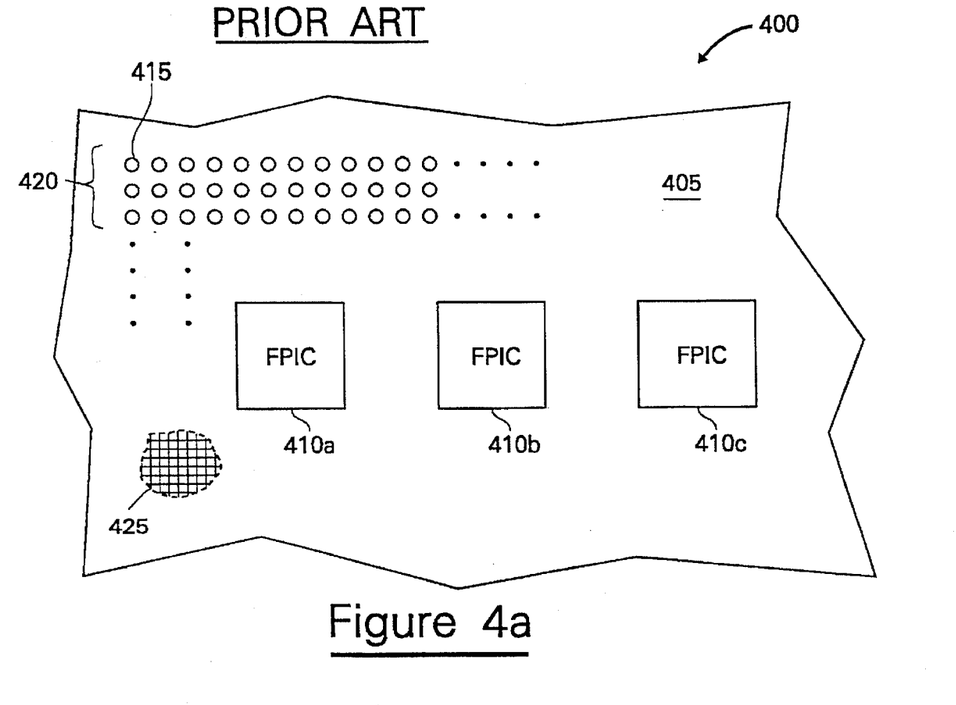
FIG. 4a is a plan view of a prior art FPCB (Field-Programmable Circuit Board).

FIG. 4a is a plan view of an FPCB 400. A multi-layer printed ciruit board 405 has an array 420 of through holes 415, and FPIC's (Field Programmable InterConnect) 410a, 410b, and 410c, where each through hole is connected individually by means of an embedded routing grid (conceptually shown as 425) to a pin of an FPIC 410a, 410b, or 410c. The FPIC's 410a, 410b and 410c are essentially programmable cross-point switches which permit any through hole to be connected to any other through hole.

Figure 4B:
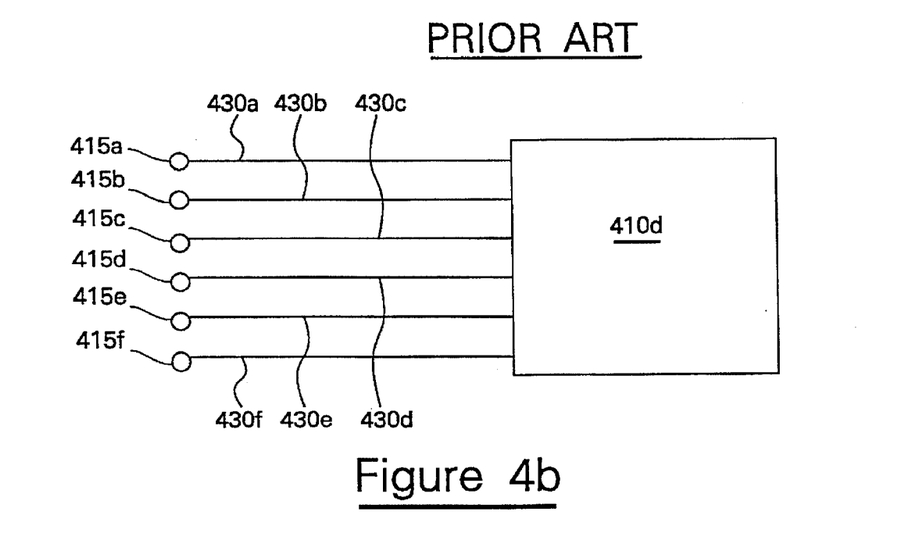
FIG. 4b is a schematic diagram showing connections from selected through holes to an FPIC (Field-Programmable InterConnect), according to the prior art.

FIG. 4b is a schematic diagram showing six representative through holes 415a, 415b, 415c, 415d, 415e, and 415f connect via lines 430a, 430b, 430c, 430d, 430e, and 430f, respectively to an FPIC 410d, which acts as a cross-point switch, permitting any-to-any connections between the holes.

The cost-effectiveness of an ASIC design can rapidly be destroyed if it becomes necessary to go through second and third passes at the design. NRE charges (non-recurring engineering charges by the ASIC manufacturer for the service of building the ASICs) are usually computed into the cost of the system being designed. If a serious over-run should occur in NRE, then the cost of the system may be driven up, negating at least part of the benefit of using the ASIC in the first place.

In response to the problem of simulation of ASICs and programmable logic, systems such as "Quick Turn" have been designed. This system is based essentially upon a computer controlled box of programmable logic which can be configured to create a functional equivalent of an ASIC. However, since it is necessary to use moderately long cables with this system, among other reasons, emulation speeds are relatively slow, providing a simulation at significantly less than full-speed, especially for fast systems.

Other systems have been built which allow pre-existing integrated circuits to be "plugged into" software-based simulations by providing an interface which can be accessed by the software simulation. This interface accepts descriptions from the software simulation about the various states, signals and drive levels that should be presented at selected pins of the pre-existing integrated circuit. The interface then appropriately exercises these pins and reports the pre-existing integrated circuit's responses back to the software simulation, which then uses this information to complete its function. Such hardware simulation interfaces include systems such as: "RealCHIP" by Valid Logic Systems, Inc. and LMSI (Logic Modelling Systems, Inc.).

None of the aforementioned simulation or testing techniques permits in-situ (meaning "physically in the target environment"), at-speed testing of a system with an inchoate ASIC (defined hereinabove). The term "inchoate ASIC" is further defined for the purposes of this specification to be an ASIC incorporating a core-cell, which has been designed but has not yet been fabricated. The closest physical approximation to testing a system with an inchoate ASIC is provided by in-circuit emulators, which provide in-situ, at-speed testing of systems incorporating standard microprocessors (arguably "inchoate" microprocessors, if they are not readily available).

As a result, there is little certainty of the success of any system design incorporating an inchoate ASIC until the physical parts have been received and tested in-situ. Until the physical ASIC parts have been received and tested, there is a great deal of uncertainty about both the design of the inchoate ASIC and the design of the system to which the inchoate ASIC is applied.

Reference is made to commonly-owned U.S. Pat. No 4,901,259, entitled ASIC EMULATOR, incorporated by reference herein, which is discussed hereinbelow.

DISCLOSURE OF THE INVENTION

It is therefore an object of the present invention to provide a technique for in-situ, at-speed testing of the final implementation of an electronic system incorporating an inchoate ASIC by providing means for emulating the inchoate ASIC.

It is a further object of the present invention to provide a technique for at-speed, in-situ testing of the final implementation of an electronic system incorporating an inchoate ASIC which provides plug-compatibility with the inchoate ASIC.

It is a further object of the present invention to provide a technique for simultaneous, integrated verification of an inchoate ASIC and its target environment.

According to the invention, there is a target system designed to incorporate an inchoate ASIC which is to be tested. An interim electronic system is built with a socket for receiving the inchoate ASIC. The interim electronic system is identical in all regards to the target electronic system, except that the inchoate ASIC is not present and a socket has been provided in its place. (A "socket" for an inchoate ASIC is defined as any interface to the interim electronic system wherein all of the electrical connections to the inchoate ASIC are provided on the interface). Typically, this will be an IC (integrated circuit) socket designed to accept the physical ASIC in its final form.) This interim electronic system is effectively identical to the target electronic with the inchoate ASIC missing, but where the signal connections to the ASIC are provided on an interface (socket).

Further, a separate "pod" is provided, having a plug designed to interface with the socket on the interim electronic system. A functional model of the core-cell on the inchoate ASIC is incorporated into the pod, along with one or more programmable logic devices which are configured to simulate the function of any surrounding logic (surrounding and/or connected to the core cell) on the ASIC. The pod, then, effectively comprises a plug-in replacement for the inchoate ASIC.

In one embodiment, this pod is constructed using a FPCB or "Field-Programmable Circuit Board". An FPCB is essentially a programmable multi-layer circuit board having a number of through holes. FPIC's or "Field-Programmable Interconnects" on the FPCB act as programmable crosspoint switches, permitting any hole in the FPCB to be connected to any other hole in the FPCB. A routing grid embedded in the multi-layer FPCB connects the through holes to the FPIC's.

In one embodiment of the invention, the functional equivalent of the core-cell is provided on the pod by providing a "Q-part", or special ASIC which includes only the core cell on the inchoate ASIC. All of the interface signals of the core cell are brought out to the pins of the "Q-part". Other internal signals of the core cell may also be buffered and brought out to pins of the Q-part in order to facilitate probing of difficult-to-verify internal nodes. The core cell on the Q-part is otherwise identical to the core cell on the inchoate ASIC.

The Q-part is essentially a "bond-out" of the core-cell (an ASIC incorporating only the core cell and having all of the interface signals of the core cell "bonded out" or connected to pins of the ASIC). The plug on the pod is plugged into the socket on the interim electronic system, permitting the target electronic system to be tested as a whole, by means of the interim electronic system which models the target electronic system exactly. The pod also includes logic circuitry, typically in the form of programmable logic devices, which is designed to emulate the function of any surrounding logic on the inchoate ASIC. This logic circuitry is connected to the Q-part and to the pins of the pod and is configured as "surrogate surrounding logic", i.e., it is programmed as a functional equivalent of the surrounding logic on the inchoate ASIC.

In another embodiment, the functional model of the core-cell is provided by a software-based emulation system which emulates the function of the core cell only. The software simulation is used in conjunction with a physical (hardware) emulation system, providing a "pluggable" software based equivalent of a Q-part. The electrical signals of this software-based Q-part equivalent are brought out to the pins of the physical emulation system.

Further, according to the invention, "patch" areas are provided on the pod for providing configurable wiring between the programmable logic devices and the Q-part.

Further, according to the invention, signals from the functional model of the core-cell and/or selected signals on the pod are brought out to a connector on the pod such that external equipment (e.g. logic analyzer and/or computer-based monitoring system) may connect to the pod for the purpose of monitoring those signals. This permits detailed examination of functional characteristics of the modelled inchoate ASIC which would ordinarily not be accessible.

In another embodiment, connections to the pod are provided for the purpose of in-situ programming of the programmable logic devices.

In this manner, means are provided for at-speed, in-situ testing of systems incorporating an inchoate ASIC which further incorporates a core cell. It is possible to test both the design and function of the inchoate ASIC and the design and function of the system which incorporates the inchoate ASIC (integrated device and system testing).

Further, plug-compatibility with the inchoate ASIC is provided so that the target environment may be used for testing, unmodified.

Means are also provided to "plug" simulations of a core cell into a device which can simulate the remainder of the circuitry on an inchoate ASIC, which device is further plug-able into a system which has been designed to accept the inchoate ASIC for the purpose of early verification of the design and function of both the system and the inchoate ASIC.

Through the use of these various means alone and/or in combination, the objects of the invention are achieved.

Other objects, features and advantages of the invention will become apparent in light of the following description thereof.

DETAILED DESCRIPTION OF THE INVENTION

In one embodiment, the present invention makes use of a Q-part, (or qualification part) which is essentially a core module with pins. By way of example, if-core microprocessor 104 (FIG. 1a) were integrated alone onto a semiconductor die, and all of its interface signals were brought out to pins on a package, this would be a Q-part for that core microprocessor. A Q-part will usually have more interface signals than a comparable, functionally equivalent commercial counterpart, because Q-parts do not generally combine input and output signals onto a single pin.

While Q-parts are not generally provided on a commercial basis, they are known to those skilled in the art of producing semi-custom integrated circuits.

Figure 2A:
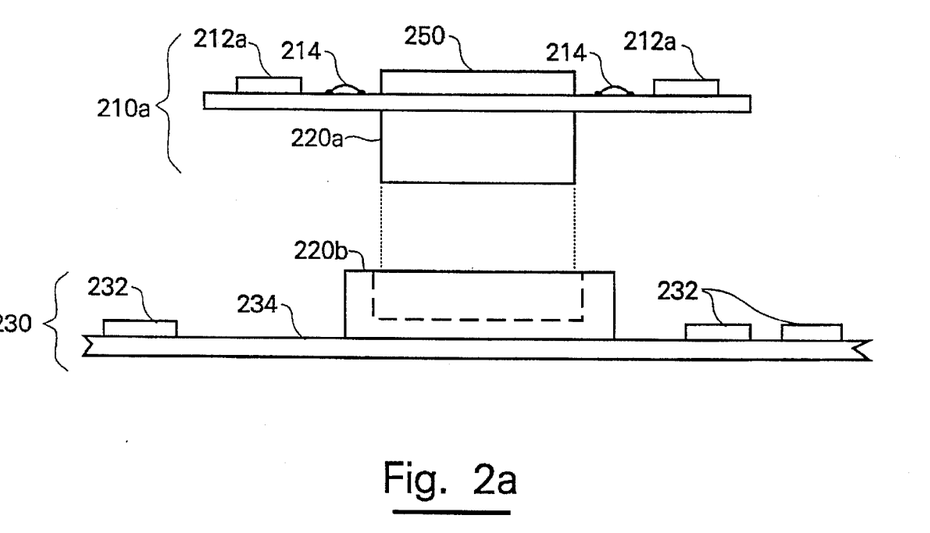
FIG. 2a is a view of one embodiment of a "pod" and its application to an interim electronic system, according to the present invention.

FIG. 2a shows a physical implementation of one embodiment of the present invention, whereby an intermediate electronic system 230 comprising a circuit board 234 upon which are mounted electronic components 232, and a socket 220b for receiving an inchoate ASIC. A pod 210a having a plug 220a which is matched to socket 220b, programmable logic components 212a, jumper wires 214 and a Q-part 250, as shown; plugs into socket 220b and emulates the function of the inchoate ASIC.

Q-part 250 is a bond-out of the core cell used in the inchoate ASIC, and it is assumed that this Q-part will have been fabricated in anticipation of the need for the testing of systems based upon one or more inchoate ASICs.

Figure 2B:
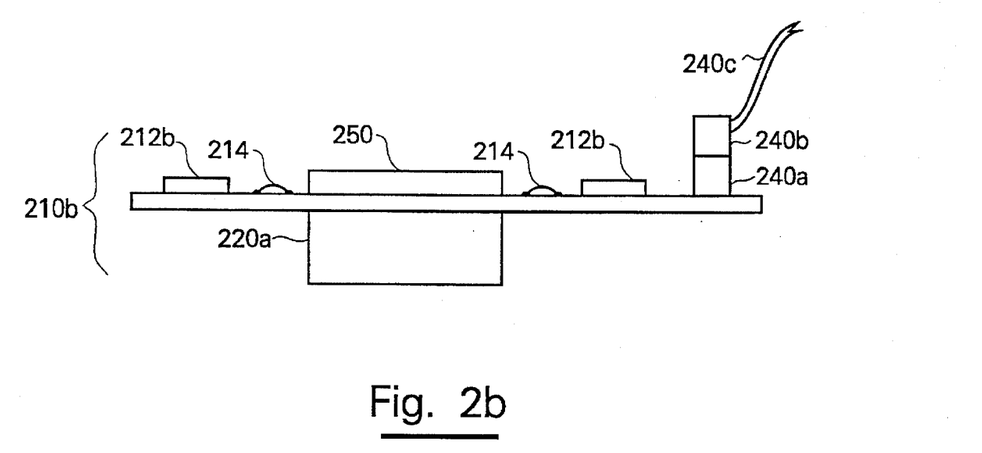
FIG. 2b is a view of another embodiment of a "pod", according to the present invention.

FIG. 2b shows another pod 210b, also having a plug 220a, programmable logic devices 212b, a Q-part 250 and jumper wires 214. Pod 210b, unlike pod 210a, also has a connector 240a which connects to various signals on the pod, and which may be connected to external equipment via a mating connector 240b and a cable 240c. (Any connection scheme may be used here, e.g., card edge connector, daughter-board, flex-circuit, soldered connections, etc.).

Pods 210a and 210b each provide a functionally equivalent and physically compatible substitute for the inchoate ASIC on intermediate electronic system 230. On both pods, programmable logic devices 212a (with respect to pod 210a and FIG. 2a) and 212b (with respect to pod 210b and FIG. 2b) perform functions equivalent to those performed by surrounding logic 182 of FIG. 1b (i.e., they are configured as surrogate surrounding logic) on the inchoate ASIC. Jumper wires 214 provide for configurable connections between programmable logic 210a (or 210b), Q-part 250, and connector 220a.

In one embodiment, (referring to pod 210b and FIG. 2b) signals from programmable logic 212b are provided at connector 240a such that programmable logic 212b may be programmed by externally connected equipment.

In another embodiment, (also pod 210b of FIG. 2b) programmable logic devices 212b are programmed to perform logic functions suited to interfacing external monitoring and/or probing equipment connected via connector 240a.

In still another embodiment, signals from Q-part 250 and/or programmable logic 212b corresponding to internal and/or external signals generated on the inchoate ASIC modelled by the pod 210b are additionally provided at plug 240a, making them available to external equipment for monitoring purposes.

The aforementioned three applications of plug 240a on pod 210b may be used alone or in combination with one another.

While connector 240a is shown as a single connector, it may be divided into multiple connectors each carrying some or all of the aforementioned signals. In this way it is possible to adapt pod 210b such that separate connections to external monitoring equipment, external programming equipment, and hardware emulation equipment may be made. Signals allocated to multiple connectors may be grouped by function or by any suitable connection strategy (typically dictated by the type of external connections to be made).

Further, provision may be made for "jumper-able" connections to connector(s) 240a, whereby jumper wires 214 may be used to configure connections to connector(s) 240a as required by a specific application.

It is generally intended, but not necessary, that pods 210a and 210b are standard parts for any given Q-part. That is, for each Q-part or each closely related group of Q-parts, there would be a "standard" pod 210a or 210b. In the event that a pod such as 210a is used, having no external programming connections; or in the case of a particular implementation of a pod 210b wherein programming connections are not provided, then programmable logic devices must be programmed off-board and assemble to the board, This may be accomplished via either permanent (soldered) or temporary (socketed) mounting of programmable logic devices 210a or 210b, as applicable.

Typically, pinouts of an inchoate ASIC based upon a core cell are not easily predictable, as they may be largely determined by the function of any surrounding logic. As such, if a standard pod is to be used for the emulation of any inchoate ASIC based upon a specific core cell, then it is necessary to provide a flexible interconnection scheme between the programmable logic 212a or 212b, the Q-part 250, and the connector 220a. This is accomplished via "patch areas", discussed in greater detail below, whereby jumper wires 214 may be used to accomplish the specific interconnections required by a specific application of pod 210a or 210b.

Figure 2C:
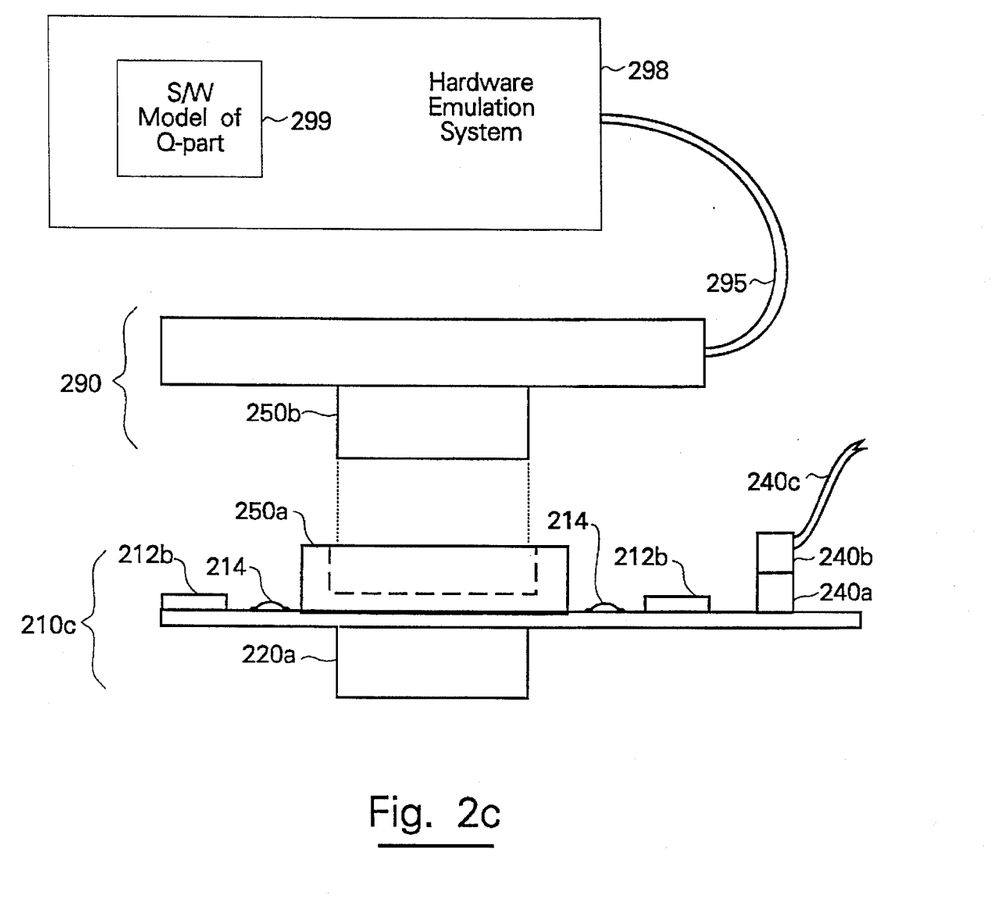
FIG. 2c is a view of a further embodiment of a "pod" as it relates to the present invention.

FIG. 2c shows a variation 210c on pod 210b whereby a software simulation 299 of the Q-part 250 is employed, rather than a physical Q-part. In this case, Q-part 250 is omitted, and is replaced on the pod 210c by a socket 250a, having all of the signals otherwise connected to Q-part 250 connected thereto. Signals from a pod 290 of a hardware emulation system 298 running the software simulation 299 are brought to the pod via connector 250b and connected to other circuitry 212b, jumper wires 214 and/or connector 220a in place of Q-part (core part) 250. A cable 295 connects pod 290 to the hardware emulation system 298 and to the signals generated by the software model 299 of the Q-part 250.

FIGS. 2a–c and the descriptions thereof indicate the use of jumpers for configurable wiring. The patch area 340 (FIGS. 3a, 3b) is the location intended for such wiring, and is made physically accessible for that purpose. However, "jumpering" and "jumper wires", as used herein, include any suitable technique for providing configurable connections, physical or logical, between a plurality of signals, such as: mechanical or electronic cross-point switching, or additional programmable logic devices, Generally, either the Q-part of FIGS. 2a and 2b or the software simulation of FIG. 2c may be considered to be "functional models" of the core cell—the core cell being a macroelement of an ultimate ASIC embedded within surrounding logic on the ASIC.

Figure 3A:
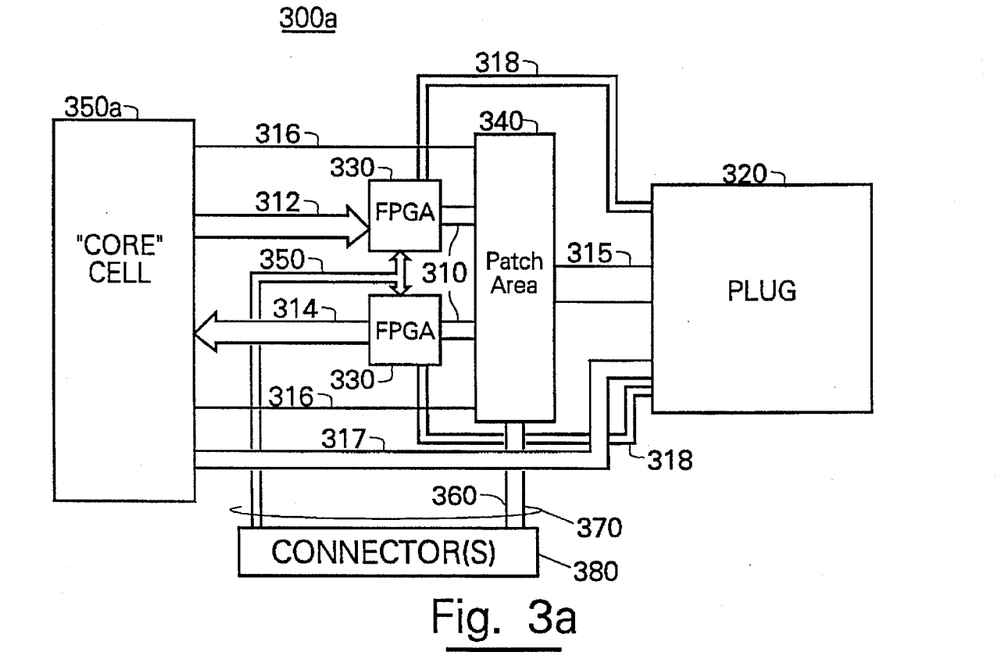
FIG. 3a is a block diagram of one embodiment of a "pod" according to the present invention, and relates to FIGS. 2a and 2b.

FIG. 3a shows a block diagram of circuitry generally suited to the requirements of a pod 210a or 210b. A "core cell", or Q-part 350a (analogous to 250 with respect to FIGS. 2a and 2b), programmable logic devices 330 (analogous to programmable logic devices 212a and 212b with respect to FIGS. 2a and 2b, respectively), a plug 320 (analogous to plug 220a), a patch area 340, and a connector 380 to external equipment (analogous to connector 240a with respect to FIG. 2b) are provided. Core Cell 350a has a plurality of interface signals 312, 314, 316 and 317. Some of these signals 316 are connected to patch area 340. Other of these signals, shown generally as a plurality of Q-part output signals 312 and Q-part input signals 314, are connected to FPGA's (Field Programmable Gate Arrays, or programmable logic devices) 330. Still other of these signals 317 connect directly to plug 320a. Some signals 310 from programmable logic devices 330 go directly to patch area 340. Other signals 318 from programmable logic devices 330 connect directly to plug 320. Another group of connections 315 connect patch area 340, 315 to plug 320.

FIG. 3a also shows one or more connectors 380 (analogous to connector 240a with respect to FIG. 2b) for connection to external equipment such as a logic analyzer, computer based monitoring probing system, or a system suited to programming FPGA's 330. Signals 350 from FPGA's 330 connect to connector(s) 380. Similarly, signals 360 from patch area 340 connect to connector(s) 380. Interconnecting signals in patch area 340, it is possible to connect connector(s) 380 to plug 320, to FPGA's 330, or to core cell 350a. Direct connections between core cell 350a and connector(s) 380 and between plug 320 and connector (s) 380 are also possible, but have been omitted to eliminate illustrative "clutter".

Typically, a "standard" pod is designed for each specific core cell or similar group of core cells. If a standard pod design is to be used for multiple core cells, then the pod (210a or 210b) design must be adapted to accept the various versions of the Q-parts which will be used. If the pin configuration of all of the Q-parts applicable to a given pod design is identical, then no adaptations are required. If, however, the Q-parts have varying pin configurations, then provisions must be made to allow reconfiguration of the connections between the Q-part 350a and the plug 320, the FPGA's 330 or the connector(s) 380. Patch area 340 provides a simple means for accomplishing this by specifically providing for such configurable connections. Patch area 340 is also intended to be used to reconfigure connections to plug 320 from other locations on the pod as required to accommodate varying inchoate ASIC pin configurations.

In one embodiment, where all inchoate ASIC connections are known in advance, or where they can be standardized such that no configuration is required other than that which can be accomplished with programmable logic, the patch area may be eliminated entirely in favor of direct connections.

Figure 3B:
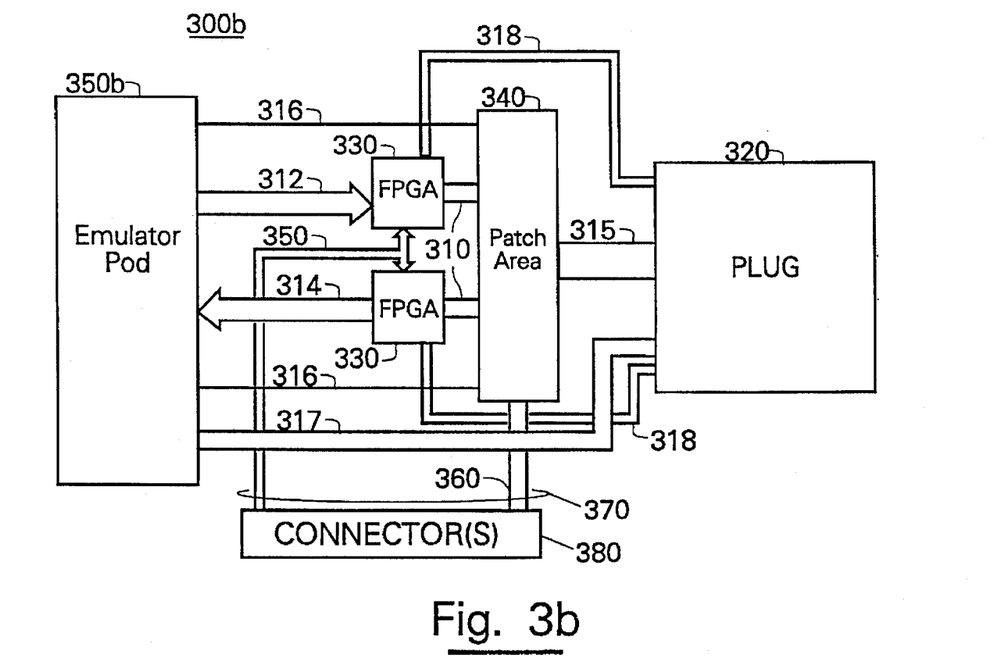
FIG. 3b is a block diagram of another embodiment of a "pod" according to the present invention, and relates to FIG. 2c.

FIG. 3b is a block diagram of the circuitry of an alternate embodiment of a pod design, similar to that of FIG. 3a, but wherein an emulator pod 350b substitutes for the core cell (Q-part) 350a of FIG. 3a. All other reference numbers and connections are identical to those of FIG. 3a. FIG. 3b relates to FIG. 2c.

With respect to FIG. 3b, an emulator pod 350b from an external hardware simulation system (not shown) provides physical connection to a software simulation of the Q-part 350a and provides functionality identical thereto.

Ordinarily, it might be argued that a software simulation model does not necessarily reflect the actual performance of the modelled part, since the simulation is only as good as the model, and software models are often simplistic and incomplete, particularly when derived from a behavioral model. In this case, however, it is assumed that because the Q-part is an ASIC implementation of a core-cell which has been extensively tested and characterized, that the software model thereof will have been derived from a gate level simulation of the core cell, and that it will have been extensively tested and compared against the actual performance of the core-cell, and will therefore be considerably more accurate than a one-of-a-kind model designed for a specific application.

Figure 5:
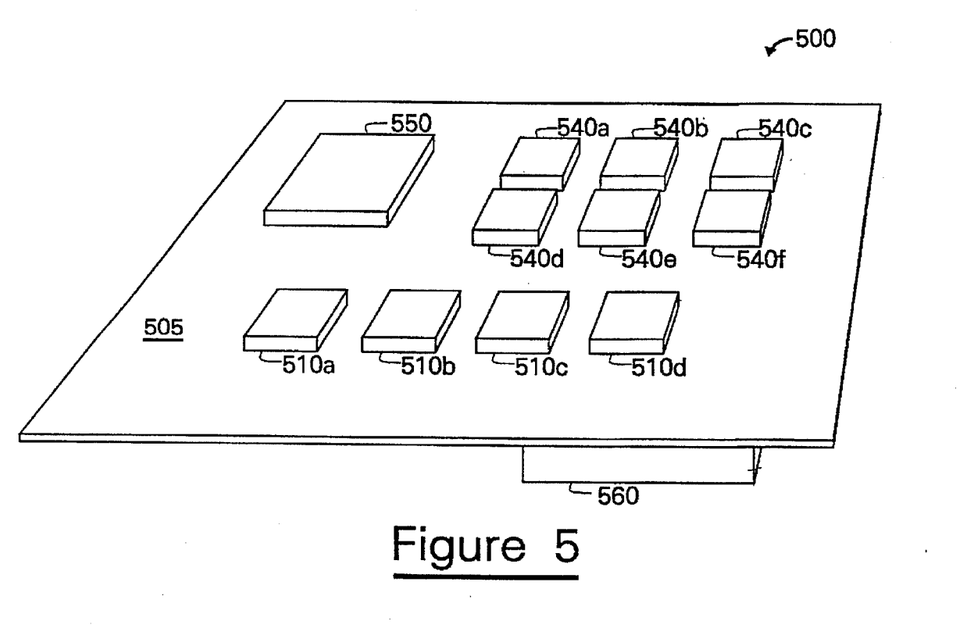
FIG. 5 is a view of a "pod", according to the present invention, implemented using an FPCB.

FIG. 5 is a view of a pod 500 implemented using a FPCB (Field-Programmable Circuit Board) 505. A Q-part 550, and six FPGA's 540a, 540b, 540c, 540d, 540e, and 540f are mounted to the FPCB 505 such that their pins extend into and are connected to selected through holes (not shown). A connector 560, adapted to plug into a target system (not shown), is provided on the bottom of the FPCB 505. The pins of connector 560 are also connected to select through holes in the FPCB 505. Four FPIC's 510a, 510b, 510c, and 510d act as programmable cross-point switches permitting fully generalized interconnection between the pins of the Q-part 550, the pins of the FPGA's 540a, 540b, 540c, 540d, 540e, and 540f, and the connector 560.

By programming the FPGA's 540a–f and FPIC's 510a–d appropriately, any desired inchoate ASIC based upon the Q-part 550 may be emulated, without requiring any hard wiring. The use of the FPCB permits the use of standardized hardware, regardless of pinout or function of the pod. While the drawings show through-holes, the same technique can be applied using surface mount technology.

In summary, the invention provides a technique for testing the final implementation of a target electronic system incorporating an inchoate ASIC, (an ASIC incorporating a core cell, which has been designed but not yet fabricated) by making use of a "Q-part" which is a bond-out of the core cell, and which has been fabricated in anticipation of the need for inchoate ASIC testing. This Q-part is applied to a "pod" which further incorporates programmable logic, an interface "plug", an optional patch area for configurable wiring, and an optional connector or connectors to external equipment. Provisions are made for on-pod programming of the programmable logic, for external monitoring equipment, and/or for external probing equipment.

In an alternate embodiment, a software model of the core cell replaces the Q-part via an external hardware emulation system connected to a similar pod.

Commonly-owned U.S. Pat. No. 4,901,259 ("Watkins"), entitled ASIC EMULATOR, discloses using a software model to emulate an ASIC device, without requiring fabrication of the device. This permits system-level testing of the to-be-fabricated ASIC, permits both the generation of system test vectors and debugging of the internal behavior of such ASIC devices without using actual physical specimens of the device. This differs from the present invention in many ways. For example:

Vis-a-vis the Q-part embodiment of the present invention (FIGS. 2a, 2b, 3a), an actual physical specimen of a major portion (core cell) of the physical ASIC is employed in conjunction with other physical devices (programmable devices acting as "surrounding logic").

Vis-a-vis the software simulation of the Q-part (FIGS. 2c, 3b), only the core cell is simulated. The remaining surrounding logic is implemented in physical devices on the pod.

The present invention provides a technique for performing interim, in-situ exercising of a system with an inchoate ASIC. This facilitates verifying the proper functionality of the ultimate ASIC in the ultimate target environment, and vice-versa, using interim physical versions of both, and provides a useful validation of the design process.

What is claimed is:

1. A method for detecting faults in an electronic system ultimately employing an ASIC comprising a core cell and surrounding logic, comprising:

constructing an interim electronic system, said interim electronic system including features of a target electronic system that will, when built, employ an ASIC having a core cell and surrounding logic, said interim electronic system lacking the ASIC and the ASIC's functionality, said interim electronic system including a socket in lieu of the ASIC;

plugging a pod into the socket, said pod including a plug for plugging into the socket, a functional model of the ASIC core cell, one or more programmable logic devices, and connections between the programmable logic devices; and configuring the programmable logic devices to perform the functions of logic surrounding the core cell in the ASIC;

with the pod connected to the interim electronic system, applying electrical test signals to the interim electronic system, observing electrical responses of the interim electronic system in response to the electrical test signals, and comparing the responses of the interim electronic system with a set of anticipated responses for the intended target electronic system;

if the responses of the interim electronic system correspond to the set of anticipated responses, determining that the interim electronic system does not have a fault; and if the responses of the interim electronic system do not correspond to the set of anticipated responses, determining that the interim electronic system has a fault.

2. The method of claim 1, wherein:
the functional model of the core cell is a Q-part.

3. The method of claim 1, wherein:
the functional model of the core cell is a software simulation of the core cell.

4. The method of claim 1, further comprising:
configuring selected connections between the functional model of the core cell, the programmable logic devices, and the plug with jumpers in a patch area on the pod.

5. The method of claim 1, further comprising:
connecting between the pod and external electronic equipment.

6. The method of claim 5, further comprising:
monitoring selected signals on the pod.

7. The method of claim 6, further comprising:
connecting the selected signals to the functional model of the core cell.

8. The method of claim 6, further comprising:
connecting the selected signals to the programmable logic devices.

9. The method of claim 6, further comprising:
connecting the selected signals to the plug.

10. The method of claim 5, wherein:
the connections between the pod and the external electronic equipment are further connected on the pod such that configuration of the programmable logic devices may be accomplished under external control.

* * * * *